United States Patent [19]

Nakai et al.

[11] Patent Number: 5,138,214
[45] Date of Patent: Aug. 11, 1992

[54] PIEZOELECTRIC TRANSDUCER AND METHOD OF ADJUSTING OSCILLATION FREQUENCY THEREOF

[75] Inventors: Toshiyuki Nakai, Osaka; Junji Tanaka, Sakurai; Yukio Nishikawa, Osaka, all of Japan

[73] Assignee: Matsushita Electric Industrial Co., Ltd., Osaka, Japan

[21] Appl. No.: 457,916

[22] Filed: Dec. 27, 1989

[51] Int. Cl.⁵ .............................................. H01L 41/08
[52] U.S. Cl. ....................................... 310/312; 310/344
[58] Field of Search ................... 324/439; 357/30; 313/633; 346/160; 310/312, 344; 29/25.35

[56] References Cited

U.S. PATENT DOCUMENTS

| | | | |
|---|---|---|---|
| 3,006,711 | 10/1961 | Silver | 310/312 |
| 3,766,616 | 10/1973 | Staudte | 310/344 |
| 3,914,836 | 10/1975 | Hafner et al. | 29/25.35 |
| 3,969,640 | 7/1976 | Staudte | 310/344 |
| 4,120,759 | 10/1978 | Asami et al. | 324/439 |
| 4,293,986 | 10/1981 | Kobayashi et al. | 310/344 |
| 4,379,244 | 4/1983 | Dinger | 310/312 |
| 4,419,533 | 12/1983 | Czubatyj et al. | 357/30 |
| 4,638,536 | 1/1987 | Vig | 310/312 |
| 4,701,772 | 10/1987 | Anderson et al. | 346/160 |
| 4,843,282 | 6/1989 | Barakitis et al. | 313/633 |
| 4,933,588 | 6/1990 | Greer | 310/312 |

FOREIGN PATENT DOCUMENTS

| | | | |
|---|---|---|---|
| 2262784 | 7/1973 | Fed. Rep. of Germany | 310/312 |
| 2335495 | 1/1975 | Fed. Rep. of Germany | 310/312 |
| 1114695 | 12/1954 | France | 310/312 |
| 0019989 | 2/1977 | Japan | 310/344 |
| 0040092 | 3/1977 | Japan | 310/344 |
| 0067995 | 6/1977 | Japan | 310/312 |
| 0139487 | 12/1978 | Japan | 310/344 |
| 0089319 | 6/1982 | Japan | 310/312 |
| 0125511 | 8/1982 | Japan | 310/344 |
| 1209810 | 8/1989 | Japan | |
| 8400082 | 1/1984 | PCT Int'l Appl. | 310/312 |
| 0971571 | 8/1962 | United Kingdom | 310/312 |

*Primary Examiner*—Mark O. Budd
*Assistant Examiner*—Thomas M. Dougherty
*Attorney, Agent, or Firm*—Pollock, VandeSande & Priddy

[57] ABSTRACT

A piezoelectric transducer arranged to allow the adjustment of its oscillation frequency. The piezoelectric transducer comprises a piezoelectric member which is encased in an airtight housing having at least one portion which allows transmission of light. The piezoelectric member has on its surfaces electrodes and is coupled to one end portions of electrical conductors the other end portions of which extend toward the external of said airtight housing. Also housed in the airtight housing is a deposition member which is evaporated in response to illumination of a light beam. The deposition member is provided so as to face the light-transmitting portion of the airtight housing.

2 Claims, 1 Drawing Sheet

PIEZOELECTRIC TRANSDUCER AND METHOD OF ADJUSTING OSCILLATION FREQUENCY THEREOF

BACKGROUND OF THE INVENTION

The present invention relates to a piezoelectric transducer, or vibrator, which is applicable particularly, but not exclusively, to electronic devices requiring a reference clock signal and a method of adjusting the oscillation frequency of the piezoelectric transducer.

A piezoelectric transducer includes a vibrating piece which has on both its surfaces electrodes for providing an electric field to the vibrating piece. The adjustment of the oscillation frequency of the piezoelectric transducer is made by partially removing the electrode provided on the vibrating piece by illumination of a laser beam (as disclosed in the Japanese Patent Provisional Publication No. 59-134412). There is a problem which arises with such an oscillation frequency adjusting method, however, in that the area of the electrode to be removed for an adequate adjustment becomes sufficiently large to thereby result in a reduction of the electric field to be produced and further increase the equivalent resistance.

SUMMARY OF THE INVENTION

It is therefore an object of the present invention to provide a piezoelectric transducer which has a simple structure and which is easy for the adjustment of the oscillation frequency and a method of effectively and accurately adjusting the oscillation frequency of the piezoelectric transducer.

The piezoelectric transducer according to the present invention comprises a piezoelectric member which is encased in an airtight housing having at least one portion which allows transmission of light. The piezoelectric member has on its surfaces electrodes and is coupled to one end portions of electrical conductors the other end portions of which extend toward the exterior of said airtight housing. A feature of the piezoelectric transducer is to provide, in the airtight housing, a deposition member which is evaporated in response to illumination of a light beam. The deposition member is provided so as to face the light-transmitting portion of the airtight housing, preferably, formed on the inner surface of the light-transmitting portion of the airtight housing by means of a deposition technique. For adjustment of the oscillation frequency of the piezoelectric transducer, the deposition member is illuminated with a laser beam emitted from the exterior of the airtight housing to be evaporated. The evaporated deposition member is attached to at least one of the electrodes provided on the piezoelectric member, whereby the oscillation frequency is adjustable in the evaporation amount of the deposition member.

BRIEF DESCRIPTION OF THE DRAWINGS

The present invention will be described in further detail with reference to the accompanying drawings, in which.

DETAILED DESCRIPTION OF THE INVENTION

Figure 1:
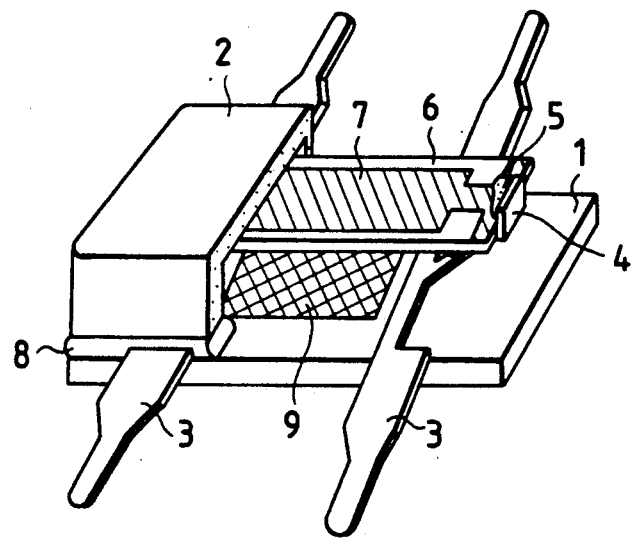
FIG. 1 is a partially broken and perspective view showing a piezoelectric transducer according to an embodiment of the present invention.

Referring now to FIG. 1, there is schematically illustrated an arrangement of a piezoelectric transducer according to an embodiment of the present invention. In FIG. 1, the piezoelectric transducer comprises a rectangular piezoelectric (vibrating) member 6 which has on both surfaces electrode plates 7 made of silver, for example, and which is supported at both sides by holding portions 4 of two electrically conductive lead traminal 3 through electrically conductive adhesive bonds 5. The electrode plates 7 are arranged to be electrically conductive to the electrically conductive lead terminals 3 through the electrically conductive bonds 5. The rectangular piezoelectric member 6, together with portions of the electrically conductive lead terminals 3, is housed in a receptacle formed by a transparent glass cover 1 and a case 2. The transparent glass cover 1 and the case 2 are integrally combined with each other by means of an adhesive bond 8 so as to form an airtight sealed receptacle. On the inner surface of the transparent glass cover 1 facing the rectangular piezoelectric member 6 is provided a metallic coated film 9 which is made of silver, for example, and which may be made in accordance with a well known deposition technique, the metallic coated film 9 being positioned at the center portion of the inner surface thereof. For forming the metallic coated film 9, the inner surface of the transparent glass cover 1 should preferably be roughened in advance by a known sand-blasting technique.

Figure 2:
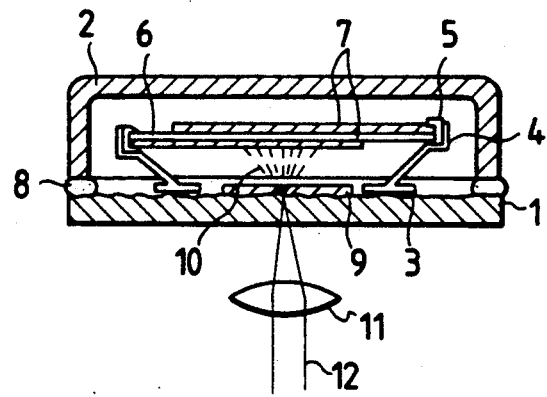
FIG. 2 is a cross-sectional illustration for describing an adjustment method of the oscillation frequency of the FIG. 1 piezoelectric transducer.

FIG. 2 is a cross-sectional illustration for describing a method of adjusting the oscillation frequency of the piezoelectric transducer described above with reference to FIG. 1. To adjust the oscillation frequency after the airtight sealing by the adhesive bond 8, the lead terminals 3 are connected to an adequate oscillator, not shown, so that the oscillation frequency is checked by means of an adequate frequency counter, not shown. In FIG. 2, illustrated at numeral 12 is a laser beam emitted from an adequate laser unit such as a YAG laser, not shown, which is arranged to be driven in response to an electric power of 0.5 to 3 W and which is arranged to be operable in a series of pulses by a switching device such as a Q switch so as to intermittently emit the laser light whose wavelength is 1060 nm, for example. The laser beam 12 emitted from the laser unit reaches, or illuminates, the metallic coated film 9, provided on the inner surface of the transparent glass cover 1, after passing through a lens 11 and the transparent glass cover 1. The lens 11 causes the laser beam 12 therefrom to be focused in the vicinity of the metallic coated film 9. Preferably, the laser beam 12 is focused before reaching the transparent glass cover 1, in order to prevent damage to the transparent glass cover 1 due to the laser beam 12. In response to the illumination by the laser beam 12, the illuminated portion of the metallic coated film 9 is evaporated in a moment. The evaporated metal 10 is attached to the electrode plate 7, which faces the metallic coated film 9, and the attachment of the evaporated metal 10 causes the lowering of the oscillation frequency of the piezoelectric member 6 by the so-called mass-addition effect. That is, the attachment of the evaporated metal to the electrode plate 7 results in an increase in the mass of the electrode plate 7, thereby allowing a lowering of the oscillation frequency of the piezoelectric member 6. Here, the laser unit and the lens 11 are movable along the surface of the transparent glass cover 1 whereby the metallic coated film 9 can be swept by the laser beam from the laser unit. This sweeping operation is repeatedly performed until the oscillation frequency reaches a predetermined value. In this embodiment, since the inner surface of the transparent glass cover 1 is roughened before forming the metallic coated film 9, after the evaporation of the metallic coated film 9, the laser beam 12 is scattered at the transparent glass cover 1 so as to prevent the laser beam from damaging the electrode plate 7. Although in the prior art the oscillation frequency adjustment is performed in a vacuum device, the oscillation frequency adjustment of this embodiment can be effected in atmosphere, thereby not requiring such a vacuum device for the oscillation frequency adjustment. Moreover since the oscillation frequency adjustment can be effected after the airtight sealing, it is possible to present variation of the adjusted oscillation frequency in assembling.

It should be understood that the foregoing relates to only preferred embodiments of the present invention, and that it is intended to cover all changes and modifications of the embodiments of the invention herein used for the purposes of the disclosure, which do not constitute departures from the spirit and scope of the invention.

What is claimed is:

1. A piezoelectric transducer comprising:
   an airtight housing having at least one portion which allows transmission of light;
   a piezoelectric member provided in said airtight housing and having electrodes on its surfaces;
   electrically conductive means one end portion of which is coupled to said electrodes provided on the surface of said piezoelectric member and the other end portion of which extends toward the outside of said airtight housing; and
   a deposition member formed by a deposition technique and provided in said airtight housing so as to face said light-transmitting portion of said airtight housing, said deposition member being a metallic coated film which is formed on an inner surface of said light-transmitting portion of said airtight housing, the inner surface of said light-transmitting portion being roughened and said deposition member being formed on the roughened inner surface thereof.

2. A method of adjusting an oscillation frequency of a piezoelectric transducer comprising an airtight housing having at least one portion which allows transmission of light; a piezoelectric member provided in said airtight housing and having electrodes on its surfaces; electrically conductive means, one end portion of which is coupled to said electrodes provided on the surface of said piezoelectric member and the other end portion of which extends toward the outside of said airtight housing; and a deposition member formed by a deposition technique and provided in said airtight housing so as to face said light-transmitting portion of said airtight housing, said oscillation-frequency adjusting method comprising the steps of:
   illuminating said deposition member with a laser beam emitted from a point external of said airtight housing;
   evaporating said deposition member so that the evaporated deposition member is attached to at least one of said electrodes provided on said piezoelectric member;
   said laser beam for the illumination of said deposition member being focused before reaching said light-transmitting portion of said airtight housing.

* * * * *